(12) United States Patent
Ikeda et al.

(10) Patent No.: US 8,093,806 B2
(45) Date of Patent: Jan. 10, 2012

(54) LIGHT-EMITTING DEVICE, METHOD FOR MANUFACTURING THE SAME, AND ELECTRONIC APPARATUS

(75) Inventors: Hisao Ikeda, Kanagawa (JP); Takahiro Ibe, Kanagawa (JP); Junichi Koezuka, Kanagawa (JP); Kaoru Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 418 days.

(21) Appl. No.: 12/135,265

(22) Filed: Jun. 9, 2008

(65) Prior Publication Data

US 2009/0001879 A1    Jan. 1, 2009

(30) Foreign Application Priority Data

Jun. 20, 2007  (JP) ................................ 2007-162046

(51) Int. Cl.
*H01L 51/00* (2006.01)
*H01L 51/50* (2006.01)
*H01L 51/52* (2006.01)
*H01L 51/54* (2006.01)

(52) U.S. Cl. ......... 313/506; 313/504; 428/688; 428/689

(58) Field of Classification Search .......... 313/498–512; 428/690–917, 688–689
See application file for complete search history.

(56) References Cited

U.S. PATENT DOCUMENTS

| 5,766,989 | A  | 6/1998  | Maegawa et al. |
| 7,158,161 | B2 | 1/2007  | Gyoutoku et al. |
| 7,838,874 | B2 | 11/2010 | Ibe et al. |
| 7,875,881 | B2 | 1/2011  | Ikeda et al. |
| 2004/0161192 | A1 | 8/2004 | Hamano et al. |
| 2005/0084712 | A1 | 4/2005 | Kido et al. |
| 2005/0098207 | A1 | 5/2005 | Matsumoto et al. |
| 2005/0170208 | A1 | 8/2005 | Yatsunami et al. |
| 2006/0008740 | A1 | 1/2006 | Kido et al. |
| 2007/0194699 | A1* | 8/2007 | Lee et al. ...................... 313/505 |
| 2007/0194705 | A1* | 8/2007 | Sung et al. ................... 313/506 |
| 2007/0200125 | A1  | 8/2007 | Ikeda et al. |
| 2007/0222379 | A1* | 9/2007 | Yamazaki et al. ............ 313/509 |
| 2007/0252525 | A1* | 11/2007 | Seki ............................ 313/509 |

(Continued)

FOREIGN PATENT DOCUMENTS

EP        1 524 706 A2    4/2005

(Continued)

OTHER PUBLICATIONS

Machine translation Kanai et al JP 08-199161 A.*

*Primary Examiner* — Peter Macchiarolo
*Assistant Examiner* — Jose M Diaz
(74) *Attorney, Agent, or Firm* — Nixon Peabody LLP; Jeffrey L. Costellia

(57) ABSTRACT

The present invention provides a light-emitting device including a light-emitting element over a substrate, the light-emitting element is partitioned from an adjacent light-emitting element by a partition wall, the light-emitting element comprising a first electrode, a layer formed over the first electrode, a light-emitting layer formed over the layer and a second electrode formed over the light-emitting layer, the layer contains an inorganic compound, an organic compound and a halogen atom, the partition wall contains the inorganic compound and the organic compound, and the layer. The light-emitting device provides higher reliability and fewer defects.

40 Claims, 9 Drawing Sheets

U.S. PATENT DOCUMENTS

| | | | |
|---|---|---|---|
| 2009/0066223 A1 * | 3/2009 | Yabe et al. | 313/504 |
| 2011/0057183 A1 | 3/2011 | Ibe et al. | |
| 2011/0111554 A1 | 5/2011 | Ikeda et al. | |

FOREIGN PATENT DOCUMENTS

| | | |
|---|---|---|
| EP | 1 530 245 A2 | 5/2005 |
| EP | 1 617 493 A2 | 1/2006 |
| JP | 08199161 A * | 8/1996 |
| JP | 9-63771 | 3/1997 |
| JP | 11-307259 | 11/1999 |
| JP | 2004-134395 | 4/2004 |
| JP | 2005-26121 | 1/2005 |
| JP | 2005-203339 | 7/2005 |
| JP | 2006-024791 | 1/2006 |
| WO | WO 2005/031798 A2 | 4/2005 |
| WO | WO 2006095539 A1 * | 9/2006 |

* cited by examiner

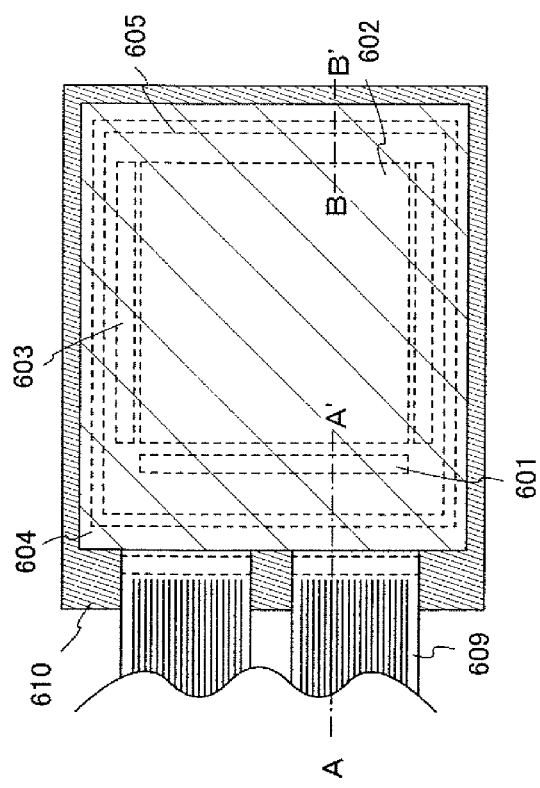
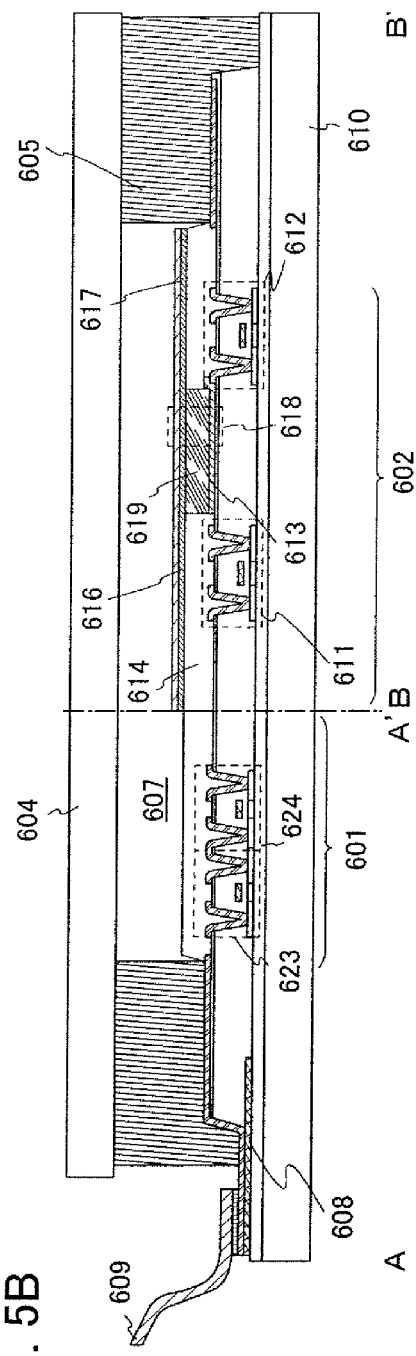
FIG. 5A
FIG. 5B

FIG. 6A
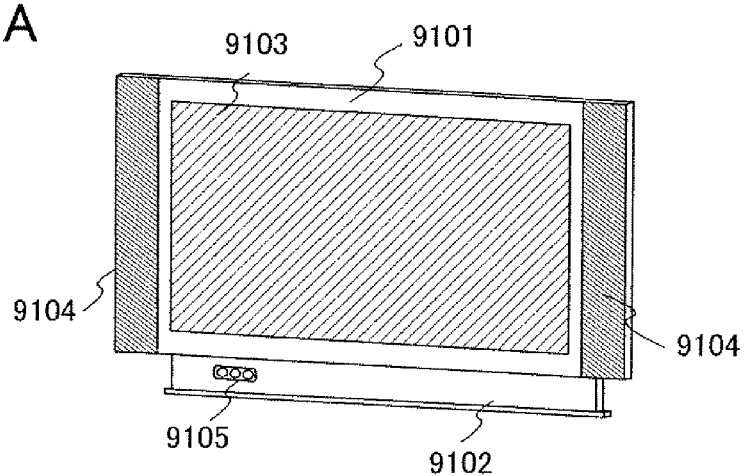
FIG. 6B
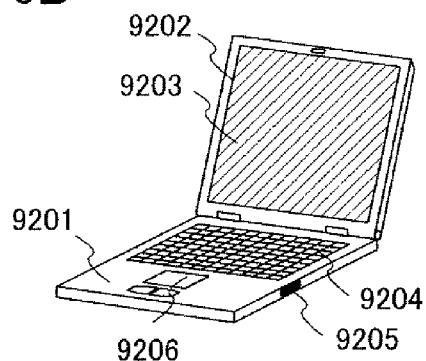
FIG. 6C
FIG. 6D
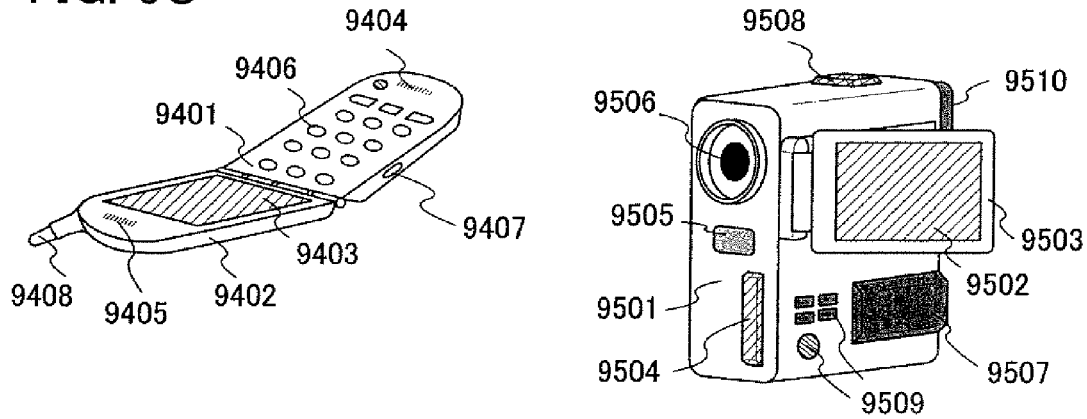

LIGHT-EMITTING DEVICE, METHOD FOR MANUFACTURING THE SAME, AND ELECTRONIC APPARATUS

BACKGROUND OF THE INVENTION

1. Field of the Invention

The present invention relates to a light-emitting device, a method for manufacturing the same, and an electronic apparatus.

2. Description of the Related Art

In recent years, research and development have been actively conducted on light-emitting elements using electroluminescence. In a basic structure of such a light-emitting element, a layer containing a substance with a light-emitting property is interposed between a pair of electrodes. By application of a voltage to this element, light emission can be obtained from a substance with a light-emitting property.

This kind of light-emitting element, which is a self-luminous element, is advantageous in that pixel visibility is high compared to that of a liquid crystal display, that no backlight is needed, and the like and thought to be suitable for use as a flat panel display element. In addition, this kind of light-emitting element is highly advantageous in that it can be fabricated to be thin and lightweight. Furthermore, response speed being extremely fast is one of the characteristics, as well.

Moreover, because such a light-emitting element can be formed into a film shape, by formation of an element with a large area, surface emission can easily be achieved. Because this characteristic is difficult to achieve with point light sources represented by incandescent light bulbs and LEDs or with line light sources represented by fluorescent lamps, the utility value for surface light sources, which can be applied to lighting and the like, is high.

Light-emitting elements using electroluminescence are broadly classified according to whether a substance with a light-emitting property is an organic compound or an inorganic compound.

When a substance with a light-emitting property is an organic compound, electrons and holes are injected into a layer containing an organic compound with a light-emitting property from a pair of electrodes by application of a voltage to a light-emitting element, and then a current flows therethrough. Recombination of electrons and holes (i.e., carriers) places the organic compound with a light-emitting property in an excited state. The organic compound with a light-emitting property returns to a ground state from the excited state, thereby emitting light. Based on this mechanism, such a light-emitting element is called a current excitation type light-emitting element.

The excited state generated by an organic compound can be a singlet excited state or a triplet excited state. Luminescence from the singlet excited state is referred to as fluorescence, and luminescence from the triplet excited state is referred to as phosphorescence.

When such a light-emitting element is used for a display mode such as a display, a partition wall made of an insulator is typically provided between each pixel. By covering an edge portion of an electrode over a substrate by a partition wall, short circuit between electrodes is prevented. However, if the inclination angle of this partition wall is large, the film thickness of an organic film in a pixel is uneven and peeling occurs between films, which results in a problem called a shrink that is a reduction in light-emitting region of a pixel. A reduction in a light-emitting region greatly decreases the reliability of a light-emitting element.

Further, other causes of short circuit between electrodes include fine particles or the like which remain over the electrode. Because a distance between electrodes of a light-emitting element is usually about 0.1 μm, even a fine particle of about 0.1 μm may easily cause short circuit between electrodes. A light-emitting element in which short circuit occurs between electrodes cannot emit light and is recognized as a dark spot. When a light-emitting element is used as a flat panel display element, such a defect reduces the commercial value of a display panel, which results in an increase in panel cost.

One of methods for preventing short circuit between electrodes which is caused by fine particles or the like is to increase the film thickness of a buffer layer. Unfortunately, however, an increase in film thickness of a buffer layer increases power consumption of a light-emitting element because the conductivity of an organic compound is generally low.

SUMMARY OF THE INVENTION

In view of the foregoing problems, it is an object of the present invention to provide a light-emitting device with higher reliability and fewer defects. Further, it is another object of the present invention is to provide a method for manufacturing the light-emitting device with higher reliability and fewer defects. Further, it is still another object of the present invention is to provide an electronic apparatus having a light-emitting device with higher reliability and fewer defects.

As a result of diligent study, the present inventors have found that a structure of a light-emitting element in which a partition wall and a buffer layer have the same film thickness or almost the same film thickness is greatly effective in inhibiting a shrink. In addition, the present inventors have found that the structure is also effective in suppressing a defect because the film thickness of the buffer layer can be increased.

One aspect of the present invention is a light-emitting device including a plurality of light-emitting elements over a substrate; the plurality of light-emitting elements is partitioned from adjacent light-emitting element by a partition wall; the light-emitting element includes a first electrode, a buffer layer formed over the first electrode, a light-emitting layer formed over the buffer layer, and a second electrode formed over the light-emitting layer; and the buffer layer and the partition wall have the same film thickness or almost the same film thickness.

In the above structure, each of the buffer layer and the partition wall preferably has a thickness of 500 nm or more because the partition wall is needed to cover a wiring or the like. The thickness of 500 nm or more enables the buffer layer to cover fine particles even if fine particles remain over the first electrode, whereby occurrence of short circuit can be inhibited.

Further, in the above structure of the light-emitting device, the buffer layer and the partition wall contain the same kind of inorganic compound and the same kind of organic compound, and the buffer layer further contains a simple substance of a halogen.

It is to be noted that, the above structure is effective particularly for the case where the first electrode is electrically connected to a thin film transistor formed over the substrate.

Another aspect of the present invention is a method for manufacturing a light-emitting device which includes the steps of forming a first electrode over a substrate, forming a layer containing an inorganic compound and an organic compound so as to cover the first electrode, forming a buffer layer and a partition wall by selective addition of a simple substance of a halogen to a region located over the first electrode in the layer containing an inorganic compound and an organic compound, forming a light-emitting layer over the region to which the simple substance of a halogen is added, and forming a second electrode over the light-emitting layer.

Still another aspect of the present invention is a method for manufacturing a light-emitting device which includes the steps of forming a plurality of thin film transistors over a substrate, forming a first electrode so as to be electrically connected to the thin film transistors, forming a layer containing an inorganic compound and an organic compound so as to cover the first electrode, forming a buffer layer and a partition wall by selective addition of a simple substance of a halogen to a region located over the first electrode in the layer containing an inorganic compound and an organic compound, forming a light-emitting layer over the region to which the simple substance of a halogen is added, and forming a second electrode over the light-emitting layer.

In the above structure, the method for manufacturing a light-emitting device can be carried out without exposure to air after the layer containing an inorganic compound and an organic compound is formed.

It is to be noted that the category of a light-emitting device in this specification includes image display apparatuses and light sources (e.g., lighting apparatuses). Further, the category of the light-emitting device also includes modules in each of which a connector such as a flexible printed circuit (FPC), a tape automated bonding (TAB) tape, or a tape carrier package (TCP) is attached to a panel; modules in each of which a printed wiring board is provided at an end of a TAB tape or a TCP; and also modules in each of which an integrated circuit (IC) is directly mounted on a light-emitting element by a chip on glass (COG) method.

Furthermore, the present invention also covers an electronic apparatus including the light-emitting device of the present invention.

In the present invention, the buffer layer and the partition wall have the same film thickness or almost the same film thickness, and this film thickness can be increased; accordingly, a light-emitting device with higher reliability and fewer defects can be provided.

Since patterning of a partition wall by photolithography is not required in the present invention, the number of mask steps in the fabrication of the substrate is reduced; therefore, a light-emitting device can be provided at low cost.

For a material of a partition wall, an organic material is typically used. At the same time, a partition wall of an organic material easily absorbs moisture; therefore, it is necessary that the partition wall be heated to remove moisture before formation of a light-emitting layer or the like. However, even if the partition wall is heated, moisture in the partition wall is not completely removed in some cases. This moisture penetrates into the light-emitting layer, which may lead to deterioration of an element. In the present invention, since the steps up to sealing can be performed without exposure to air after a partition wall is formed, moisture hardly penetrates into a light-emitting layer or the like, and thus a highly reliable light-emitting device can be provided.

BRIEF DESCRIPTION OF THE DRAWINGS

FIGS. 5A and 5B illustrate a light-emitting device of the present invention.

FIGS. 6A to 6D illustrate electronic apparatuses of the present invention.

DETAILED DESCRIPTION OF THE INVENTION

Hereinafter, embodiment modes of the present invention are described using the accompanying drawings. It is to be noted that the present invention is not limited to the description below and that a variety of changes may be made in forms and details without departing from the spirit and the scope of the present invention. Therefore, the present invention should not be limited to the description of the embodiment modes below.

Embodiment Mode 1

Figure 1:
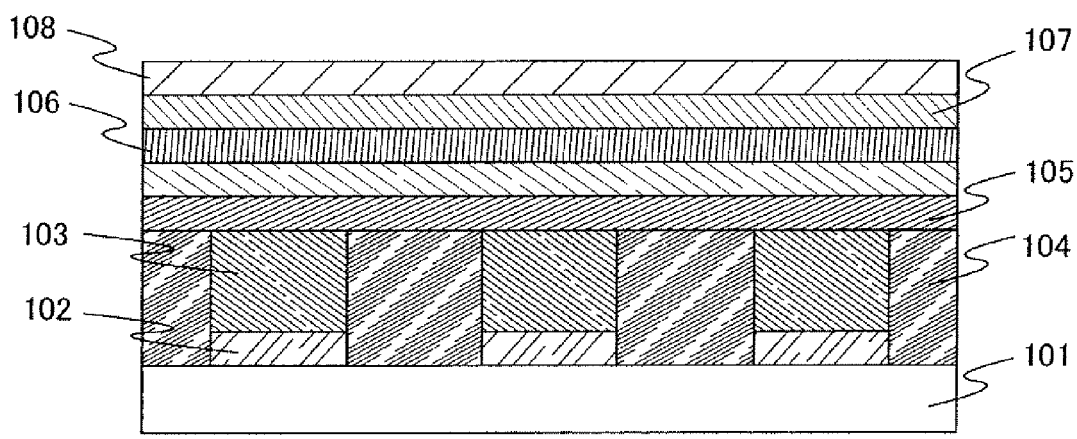
FIG. 1 illustrates a light-emitting device of the present invention.

In this embodiment mode, a light-emitting device of the present invention and a method for manufacturing the light-emitting device are described using FIG. 1.

The light-emitting device has a light-emitting element in which a plurality of layers is stacked between a pair of electrodes. The plurality of layers is formed by combining and stacking a layer formed of a substance with a high carrier-injecting property and a layer formed of a substance with a high carrier-transporting property so that a light-emitting region is formed apart from the electrodes, in other words, carriers are recombined in a portion apart from the electrodes. In the light-emitting device of the present invention, a plurality of light-emitting elements is provided, and a partition wall 104 is provided between the light-emitting elements.

In this embodiment mode, the light-emitting element includes a first electrode 102, a second electrode 108, a buffer layer 103, a hole-transporting layer 105, a light-emitting layer 106, and an electron-transporting layer 107. In the description below of this embodiment mode, it is assumed that the first electrode 102 functions as an anode and that the second electrode 108 functions as a cathode. In other words, hereinafter, it is assumed that light emission can be obtained when a voltage is applied to the first electrode 102 and the second electrode 108 so that a potential of the first electrode 102 is higher than that of the second electrode 108.

A substrate 101 is used as a support of the light-emitting element. For the substrate 101, glass, plastic, or the like, for example, can be used. It is to be noted that any material other than these may be used as long as it functions as the support in a fabrication process of the light-emitting element.

Preferably, the first electrode 102 is formed using any of metals, alloys, or conductive compounds, a mixture thereof or the like with a high work function (specifically, a work function of 4.0 eV or higher is preferable). Specifically, indium tin oxide (ITO), indium tin oxide containing silicon or silicon oxide, indium zinc oxide (IZO), indium oxide containing tungsten oxide and zinc oxide (IWZO), and the like are given, for example. Films of such conductive metal oxides are typically formed by sputtering, but may also be formed by application of a sol-gel process or the like. For example, a film of an indium zinc oxide (IZO) can be formed using a target in which 1 wt % to 20 wt % zinc oxide is added to indium oxide by a sputtering method. A film of indium oxide containing tungsten oxide and zinc oxide (IWZO) can be formed using a target in which 0.5 wt % to 5 wt % tungsten oxide and 0.1 wt % to 1 wt % zinc oxide are added to indium oxide by a sputtering method. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

When a layer containing an inorganic compound and an organic compound, which is described later, is used as a layer in contact with the first electrode 102, any of a variety of metals, alloys, or conductive compounds, a mixture thereof, or the like can be used for the first electrode 102 regardless of the work function. For example, aluminum (Al), silver (Ag), an alloy containing aluminum, or the like can be used. Alternatively, it is possible to use any of elements belonging to Group 1 and 2 of the periodic table, that is, alkali metals such as lithium (Li) and cesium (Cs), alkaline earth metals such as magnesium (Mg), calcium (Ca), and strontium (Sr), alloys containing them (e.g., MgAg and AlLi), rare earth metals such as europium (Eu) and ytterbium (Yb), alloys containing them, and the like which are materials with a low work function. Films of alkali metals, alkaline earth metals, and alloys thereof can be formed by a vacuum evaporation method. Alternatively, films of alloys containing alkali metals or alkaline earth metals can also be formed by a sputtering method. Further alternatively, such films can be formed using a silver paste by a droplet discharging method or the like.

According to one feature of the present invention, the buffer layer 103 and the partition wall 104 have the same film thickness or almost the same film thickness. Thus, surfaces of the buffer layer and the partition wall are almost flat, and the hole-transporting layer 105, the light-emitting layer 106, and the like formed over the buffer later can be formed to be flat. Thus, each of the hole-transporting layer 105, the light-emitting layer 106, and the like hardly has an uneven film thickness in a pixel, and peeling hardly occurs between the layers as well.

Further, the film thickness of the buffer layer 103 is desirably increased in order to suppress short circuit between the electrodes, which results from fine particles or the like remaining over the anode. In order to increase the film thickness, it is necessary that the buffer layer 103 be highly conductive. Accordingly, in particular, a film formed by addition of simple substance of a halogen to a mixed film of an inorganic compound and an organic compound is used for the buffer layer 103 in the present invention.

Transition metal oxides can be used as the inorganic compound used for the buffer layer 103. Alternatively, oxides of metals that belong to Group 4 to Group 8 of the periodic table can be used. Specifically, use of vanadium oxide, niobium oxide, tantalum oxide, chromium oxide, molybdenum oxide, tungsten oxide, manganese oxide, or rhenium oxide is preferable because of their high electron accepting properties. In particular, use of molybdenum oxide is preferable because of its stability in air, a low hygroscopic property, and ease of handling. Alternatively, use of molybdenum trioxide is further preferable.

As the organic compound used for the buffer layer 103, any of a variety of compounds such as an aromatic amine compound, a carbazole derivative, an aromatic hydrocarbon, an oligomer, a dendrimer, or a polymer can be used. It is to be noted that as the organic compound used for the buffer layer,
a compound with a high hole-transporting property (hereinafter, referred to as a hole-transporting material) is preferably used. Specifically, a substance having a hole mobility of $10^{-6}$ cm$^2$/(V·s) or more is preferably used. However, any substance other than the above substances may also be used as long as it is a substance in which the hole-transporting property is higher than the electron-transporting property. Hereinafter, organic compounds that can be used for the buffer layer 103 are specifically described.

Examples of the aromatic amine compounds include N,N'-di(p-tolyl)-N,N'-diphenyl-p-phenylenediamine (abbreviated to DTDPPA), 4,4'-bis[N-(4-diphenylaminophenyl)-N-phenylamino]biphenyl (abbreviated to DPAB), 4,4'-bis(N-{4-[N', N'-bis(3-methylphenyl)aminophenyl]-N-phenyl}amino)biphenyl (abbreviated to DNTPD), 1,3,5-tris[N-(4-diphenylaminophenyl)-N-phenylamino]benzene (abbreviated to DPA3B), and the like.

Examples of the carbazole derivatives that can be used for the buffer layer 103 include 3-[N-(9-phenylcarbazol-3-yl)-N-phenylamino]-9-phenylcarbazole (abbreviated to PCzPCA1), 3,6-bis[N-(9-phenylcarbazol-3-yl)-N-phenylamino]-9-phenylcarbazole (abbreviated to PCzPCA2), 3-[N-(1-naphtyl)-N-(9-phenylcarbazol-3-yl)amino]-9-phenylcarbazole (abbreviated to PCzPCN1), and the like.

Moreover, 4,4'-di(N-carbazolyl)biphenyl (abbreviated to CBP), 1,3,5-tris[4-(N-carbazolyl)phenyl]benzene (abbreviated to TCPB), 9-[4-(N-carbazolyl)phenyl]-10-phenylanthracene (abbreviated to CzPA), 1,4-bis[4-(N-carbazolyl)phenyl]-2,3,5,6-tetraphenylbenzene, or the like can be used.

Examples of the aromatic hydrocarbons that can be used for the buffer layer 103 include 2-tert-butyl-9,10-di(2-naphthyl)anthracene (abbreviated to t-BuDNA), 2-tert-butyl-9,10-di(1-naphthyl)anthracene, 9,10-bis(3,5-diphenylphenyl) anthracene (abbreviated to DPPA), 2-tert-butyl-9,10-bis(4-phenylphenyl)anthracene (abbreviated to t-BuDBA), 9,10-di (2-naphthyl)anthracene (abbreviated to DNA), 9,10-diphenylanthracene (abbreviated to DPAnth), 2-tert-butylanthracene (abbreviated to t-BuAnth), 9,10-bis(4-methyl-1-naphthyl)anthracene (abbreviated to DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis [(2,3,4,5,6-pentaphenyl)phenyl]-9,9'-bianthryl, anthracene, tetracene, rubrene, perylene, 2,5,8,11-tetra(tert-butyl)perylene, and the like. Besides these compounds, pentacene, coronene, or the like can alternatively be used. As described above, use of an aromatic hydrocarbon which has a hole mobility of $1 \times 10^{-6}$ cm$^2$/(V·s) or more and has 14 to 42 carbon atoms is more preferable.

It is to be noted that the aromatic hydrocarbons which can be used for the buffer layer 103 may have a vinyl skeleton. Examples of the aromatic hydrocarbons having a vinyl skeleton include 4,4'-bis(2,2-diphenylvinyl)biphenyl (abbreviated to DPVBi), 9,10-bis[4-(2,2-diphenylvinyl)phenyl]anthracene (abbreviated to DPVPA), and the like.

Furthermore, a high molecular compound such as poly(N-vinylcarbazole) (abbreviated to PVK), poly(4-vinyltriphenylamine) (abbreviated to PVTPA), poly[N-(4-{N'-[4-(4-diphenylamino)phenyl]phenyl-N'-phenylamino}phenyl) methacrylamide] (abbreviated to PTPDMA), or poly[N,N'-bis(4-butylphenyl)-N,N'-bis(phenyl)benzidine] (abbreviated to Poly-TPD) can be used.

Examples of the simple substance of a halogen which can be used for the buffer layer 103 include fluorine, chlorine, iodine, bromine, and the like, and use of fluorine or chlorine is preferable in particular.

In addition, the partition wall 104 is formed using a mixed film of an inorganic compound and an organic compound which is also used for the buffer layer 103.

In addition, because it is necessary that the buffer layer completely cover the fine particles remaining over the anode and that the partition wall completely cover a wiring or the like, each of the buffer layer and the partition wall preferably has a thickness of 500 nm or more.

A hole-transporting layer 105 is a layer that contains a substance having a high hole-transporting property. Examples of the substance having a high hole-transporting property include aromatic amine compounds such as 4,4'-bis [N-(1-naphthyl)-N-phenylamino]biphenyl (abbreviated to NPB), N,N'-bis(3-methylphenyl)-N,N'-diphenyl-[1,1'-biphenyl]-4,4'-diamine (abbreviated to TPD), 4,4',4"-tris(N,N-diphenylamino)triphenylamine (abbreviated to TDATA), 4,4',4"-tris[N-(3-methylphenyl)-N-phenylamino]triphenylamine (abbreviated to MTDATA), and 4,4'-bis[N-(spiro-9, 9'-bifluoren-2-yl)-N-phenylamino]-1,1'-biphenyl (abbreviated to BSPB). These substances described here are mainly substances having a hole mobility of $10^{-6}$ cm$^2$/Vs or more. However, any substance other than the above substances may also be used as long as it is a substance in which the hole-transporting property is higher than the electron-transporting property. The layer that contains a substance having a high hole-transporting property is not limited to a single layer and may be a stack of two or more layers each formed of the aforementioned substance.

For the hole-transporting layer, a high molecular compound such as poly(N-vinylcarbazole) (abbreviated to PVK) or poly(4-vinyltriphenylamine) (abbreviated to PVTPA) can alternatively be used.

The light-emitting layer is a layer that contains a substance with a high light-emitting property. As a substance with a high light-emitting property, a fluorescent compound that emits fluorescence or a phosphorescent compound that emits phosphorescence can be used.

As the phosphorescent compound that can be used for the light-emitting layer, examples of a blue light-emitting material include bis[2-(4',6'-difluorophenyl)pyridinato-N,C$^{2'}$]iridium(III)tetrakis(1-pyrazolyl)borate (abbreviated to FIr6), bis[2-(4',6'-difluorophenyl)pyridinato-N,C$^{2'}$]iridium(III)picolinate (abbreviated to FIrpic), bis{2-[3',5'-bis(trifluoromethyl)phenyl]pyridinato-N,C$^{2'}$}iridium(III)picolinate (abbreviated to Ir(CF$_3$ ppy)$_2$(pic)), bis[2-(4',6'-difluorophenyl)pyridinato-N,C$^{2'}$]iridium(III)acetylacetonate (abbreviated to FIr(acac)), and the like. Examples of green light-emitting material include tris(2-phenylpyridinato-N, C$^{2'}$)iridium(III) (abbreviated to Ir(ppy)$_3$), bis(2-phenylpyridinato-N, C$^{2'}$)iridium(III)acetylacetonate (abbreviated to Ir(ppy)$_2$(acac)), bis (1,2-diphenyl-1H-benzimidazolato)iridium(III)acetylacetonate (abbreviated to Ir(pbi)$_2$(acac)), bis(benzo[h]quinolinato) iridium(III)acetylacetonate (abbreviated to Ir(bzq)$_2$(acac)), and the like. Examples of a yellow light-emitting material include bis(2,4-diphenyl-1,3-oxazolato-N,C$^2$)iridium(III) acetylacetonate (abbreviated to Ir(dpo)$_2$(acac)), bis{2-[4'-(perfluorophenylphenyl)pyridinato-N,C$^{2'}$]iridium(III)acetylacetonate (abbreviated to Ir(p-PF-ph)$_2$(acac)), bis(2-phenylbenzothiazolato-N, C$^{2'}$)iridium(III)acetylacetonate (abbreviated to Ir(bt)$_2$(acac)), and the like. Examples of an orange light-emitting material include tris(2-phenylquinolinato-N, C$^{2'}$)iridium(III) (abbreviated to Ir(pq)$_3$), bis(2-phenylquinolinato-N,C$^{2'}$)iridium(III)acetylacetonate (abbreviated to Ir(pq)$_2$(acac)), and the like. Examples of a red light-emitting material include organic metal complexes such as bis(2-(2'-benzo[4,5-α]thienyl)pyridinato-N,C$^{3'}$)iridium(III) acetylacetonate (abbreviated to Ir(btp)$_2$(acac)), bis(1-phenyl-isoquinolinato-N,C$^{2'}$)iridium(III)acetylacetonate (abbreviated to Ir(piq)$_2$(acac)), (acetylacetonato)bis[2,3-bis(4-fluorophenyl)quinoxalinato]iridium(III) (abbreviated to Ir(Fdpq)$_2$(acac)), and 2,3,7,8,12,13,17,18-octaethyl-21H, 23H-porphine platinum(II) (abbreviated to PtOEP). In addition, a rare-earth metal complex such as tris(acetylacetonato) (monophenanthroline)terbium(III) (abbreviated to Tb(acac)$_3$ (Phen)), tris(1,3-diphenyl-1,3-popanedionato) (monophenanthroline)europium(III) (abbreviated to Eu(DBM)$_3$(Phen)), or tris[1-(2-thenoyl)-3,3,3-trifluoroacetonato](monophenanthroline)europium(III) (abbreviated to Eu(TTA)$_3$(Phen)) performs light emission (electron transition between different multiplicities) from a rare-earth metal ion; therefore, such a rare-earth metal complex can be used as the phosphorescent compound.

As the fluorescent compound which can be used for the light-emitting layer, examples of a blue light-emitting material include N,N'-bis[4-(9H-carbazol-9-yl)phenyl]-N,N'-diphenylstilbene-4,4'-diamine (abbreviated to YGA2S), 4-(9H-carbazol-9-yl)-4'-(10-phenyl-9-anthryl)triphenylamine (abbreviated to YGAPA), and the like. Examples of a green light-emitting material include N-(9,10-diphenyl-2-anthryl)-N,9-diphenyl-9H-carbazol-3-amine (abbreviated to 2PCAPA), N-[9,10-bis(1,1'-biphenyl-2-yl)-2-anthryl]-N,9-diphenyl-9H-carbazol-3-amine (abbreviated to 2PCABPhA), N-(9,10-diphenyl-2-anthryl)-N,N',N'-triphenyl-1,4-phenylenediamine (abbreviated to 2DPAPA), N-[9,10-bis(1, 1'-biphenyl-2-yl)-2-anthryl]-N,N',N'-triphenyl-1,4-phenylenediamine (abbreviated to 2DPABPhA), N-[9,10-bis (1,1'-biphenyl-2-yl)]-N-[4-(9H-carbazol-9-yl)phenyl]-N-phenylanthracene-2-amine (abbreviated to 2YGABPhA), N,N,9-triphenylanthracen-9-amine (abbreviated to DPhAPhA), and the like. Examples of a yellow light-emitting material include rubrene, 5,12-bis(1,1'-biphenyl-4-yl)-6,11-diphenyltetracene (abbreviated to BPT), and the like. Examples of a red light-emitting material include N,N,N',N'-tetrakis(4-methylphenyl)tetracene-5,11-diamine (abbreviated to p-mPhTD), 7,13-diphenyl-N,N,N',N'-tetrakis(4-methylphenyl)acenaphtho[1,2-a]fluoranthene-3,10-diamine (abbreviated to p-mPhAFD), and the like.

For the electron-transporting layer 107, a substance with a high electron-transporting property can be used. For example, the electron-transporting layer 107 can be formed using a metal complex or the like having a quinoline skeleton or a benzoquinoline skeleton, such as tris(8-quinolinolato) aluminum (abbreviated to Alq), tris(4-methyl-8-quinolinolato)aluminum (abbreviated to Almq$_3$), bis(10-hydroxybenzo [h]quinolinato)beryllium (abbreviated to BeBq$_2$), or bis(2-methyl-8-quinolinolato)(4-phenylphenolato)aluminum (abbreviated to BAlq). Alternatively, a metal complex or the like having an oxazole-based or thiazole-based ligand, such as bis[2-(2-hydroxyphenyl)benzoxazolato]zinc (abbreviated to Zn(BOX)$_2$) or bis[2-(2-hydroxyphenyl)benzothiazolato] zinc (abbreviated to Zn(BTZ)$_2$) can also be used. Instead of metal complexes, 2-(4-biphenylyl)-5-(4-tert-butylphenyl)-1, 3,4-oxadiazole (abbreviated to PBD), 1,3-bis[5-(p-tert-butylphenyl)-1,3,4-oxadiazol-2-yl]benzene (abbreviated to OXD-7), 3-(4-biphenylyl)-4-phenyl-5-(4-tert-butylphenyl)-1,2,4-triazole (abbreviated to TAZ), bathophenanthroline (abbreviated to BPhen), bathocuproine (abbreviated to BCP), or the like can alternatively be used. The substances described here are mainly substances each having an electron mobility of $10^{-6}$ cm$^2$/Vs or more. However, any substance other than the above substances may also be used as long as it is a substance in which the electron-transporting property is higher than the hole-transporting property. Furthermore, the electron-transporting layer is not limited to a single layer and may be a stack of two or more layers each formed of the aforementioned substance.

For the electron-transporting layer 107, a high molecular compound can be used. For example, poly[(9,9-dihexylfluorene-2,7-diyl)-co-(pyridine-3,5-diyl)](abbreviated to PF-Py), poly[(9,9-dioctylfluorene-2,7-diyl)-co-(2,2'-bipyridine-6,6'-diyl)] (abbreviated to PF-BPy), or the like can be used.

The second electrode 108 can be formed using a metal, an alloy, or a conductive compound, a mixture thereof, or the like with a low work function (specifically, 3.8 eV or lower). Specific examples of such a material with a low work function include elements belonging to Group 1 and 2 of the periodic table, that is, alkali metals such as lithium (Li) and cesium (Cs), alkaline earth metals such as magnesium (Mg), calcium (Ca), and strontium (Sr), alloys containing them (e.g., MgAg and AlLi), rare earth metals such as europium (Eu) and ytterbium (Yb), alloys containing them, and the like. However, when a layer having a function of promoting electron injection is provided between the second electrode 108 and the electron-transporting layer, any of a variety of conductive materials such as Al, Ag, ITO, and indium tin oxide containing silicon or silicon oxide can be used for the second electrode 108 regardless of the work function. Films of these conductive materials can be formed by a sputtering method, an inkjet method, a spin coating method, or the like.

For the layer having a function of promoting electron injection, an alkali metal, an alkaline earth metal, or a compound thereof such as lithium fluoride (LiF), cesium fluoride (CsF), or calcium fluoride ($CaF_2$) can be used. Alternatively, a layer formed of a substance with an electron-transporting property which contains an alkali metal, an alkaline earth metal, or a compound thereof, for example, a layer formed of Alq which contains magnesium (Mg), or the like can be used. It is more preferable to use the layer formed of a substance with an electron-transporting property which contains an alkali metal or an alkaline earth metal because electron can be injected efficiently from the second electrode 108 by the use of such a layer.

Any of a variety of methods can be employed for forming the buffer layer 103, the hole-transporting layer 105, the light-emitting layer 106, and the electron-transporting layer 107 regardless of whether the method is a dry process or a wet process. For example, a vacuum evaporation method, an inkjet method, a spin-coating method, or the like may be employed. Further, different formation methods may be employed for each electrode or layer.

Similarly, the electrodes may also be formed by a wet process such as a sol-gel process or by a wet process using a paste of a metal material. Alternatively, the electrodes may also be formed by a dry process such as a sputtering method or a vacuum evaporation method.

Light is extracted outside through one or both of the first electrode 102 and the second electrode 108. Thus, one or both of the first electrode 102 and the second electrode 108 are light-transmitting electrodes. When only the first electrode 102 is a light-transmitting electrode, light is extracted from the substrate side through the first electrode 102. In contrast, when only the second electrode 108 is a light-transmitting electrode, light is extracted from a side opposite to the substrate side through the second electrode 108. When both the first electrode 102 and the second electrode 108 are light-transmitting electrodes, light is extracted from both the substrate side and the side opposite to the substrate side through the first electrode 102 and the second electrode 108.

In this embodiment mode, the light-emitting element is fabricated over a substrate formed of glass, plastic, or the like. In addition, for example, a thin film transistor (TFT) may be formed over a substrate formed of glass, plastic, or the like, and a light-emitting element may be fabricated over an electrode that is electrically connected to the TFT. Accordingly, an active matrix light-emitting device in which drive of the light-emitting element is controlled by a TFT can be manufactured. It is to be noted that there is no particular limitation on the structure of the TFT. A staggered TFT or an inversely staggered TFT may be used. Also, there is no particular limitation on the crystallinity of a semiconductor that is to be used for the TFT, and an amorphous semiconductor or a crystalline semiconductor may be used. Alternatively, a single crystal semiconductor film may be used. A single crystal semiconductor film can be formed by Smart Cut (registered trademark) or the like. In addition, a driver circuit formed over a TFT substrate may include both an n-channel TFT and a p-channel TFT or either an n-channel TFT or a p-channel TFT.

Embodiment Mode 2

In this embodiment mode, a method for forming a buffer layer 204 and a partition wall 205 as described in Embodiment Mode 1 is described. As described in Embodiment Mode 1, the buffer layer 204 and the partition wall 205 have the same film thickness or almost the same film thickness. In addition, the buffer layer and the partition wall contains the same kind of organic compound and the same kind of inorganic compound, and the buffer layer 204 further contains a simple substance of a halogen.

Figure 2A:
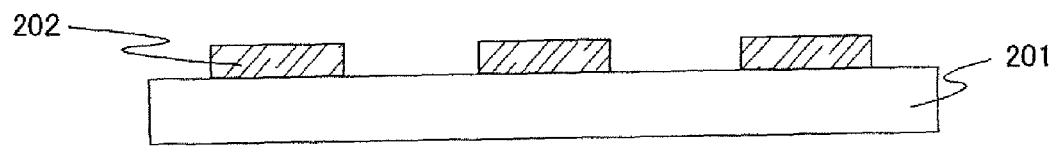
FIGS. 2A and 2B illustrate a method for manufacturing a light-emitting device of the present invention.
Figure 2B:
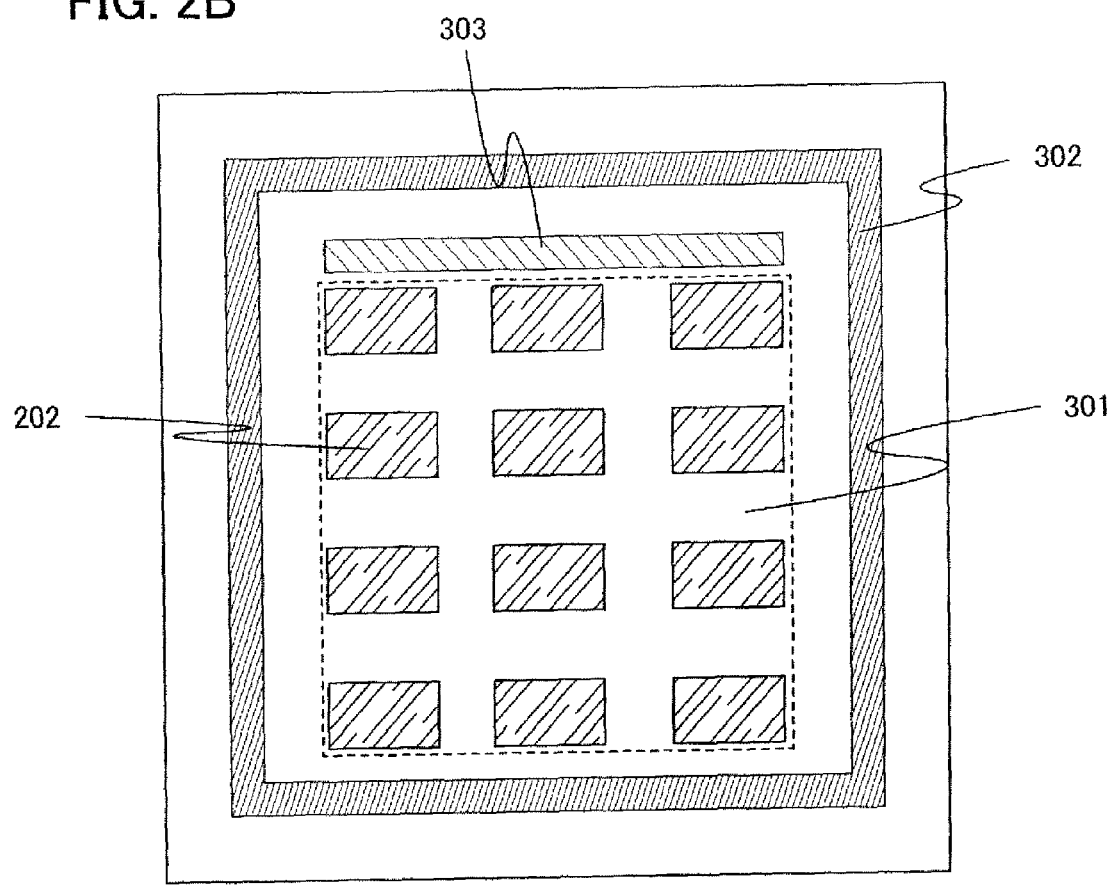

In FIGS. 2A and 2B, several divided first electrodes 202 are provided over a substrate 201. FIG. 2A is a cross-sectional view, and FIG. 2B is a top view. The first electrode 202 corresponds to each pixel and is disposed in a pixel region 301. In the sealing region 302, a sealing material is disposed so as to surround the pixel region. Desirably, no organic material exists under the sealing material. In addition, desirably, no organic material exists in a contact portion 303 of the second electrode and the wiring.

Figure 3A:
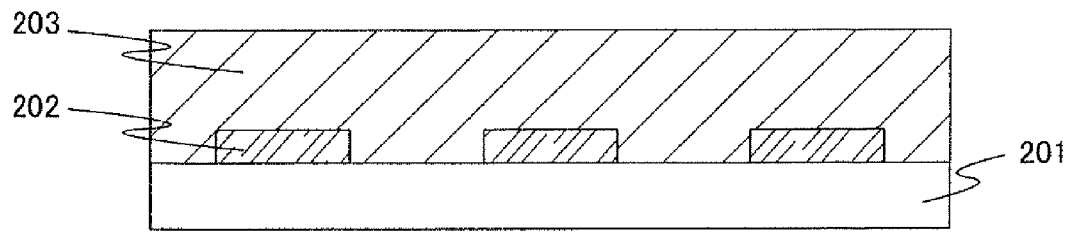
FIGS. 3A and 3B illustrate a method for manufacturing a light-emitting device of the present invention.
Figure 3B:
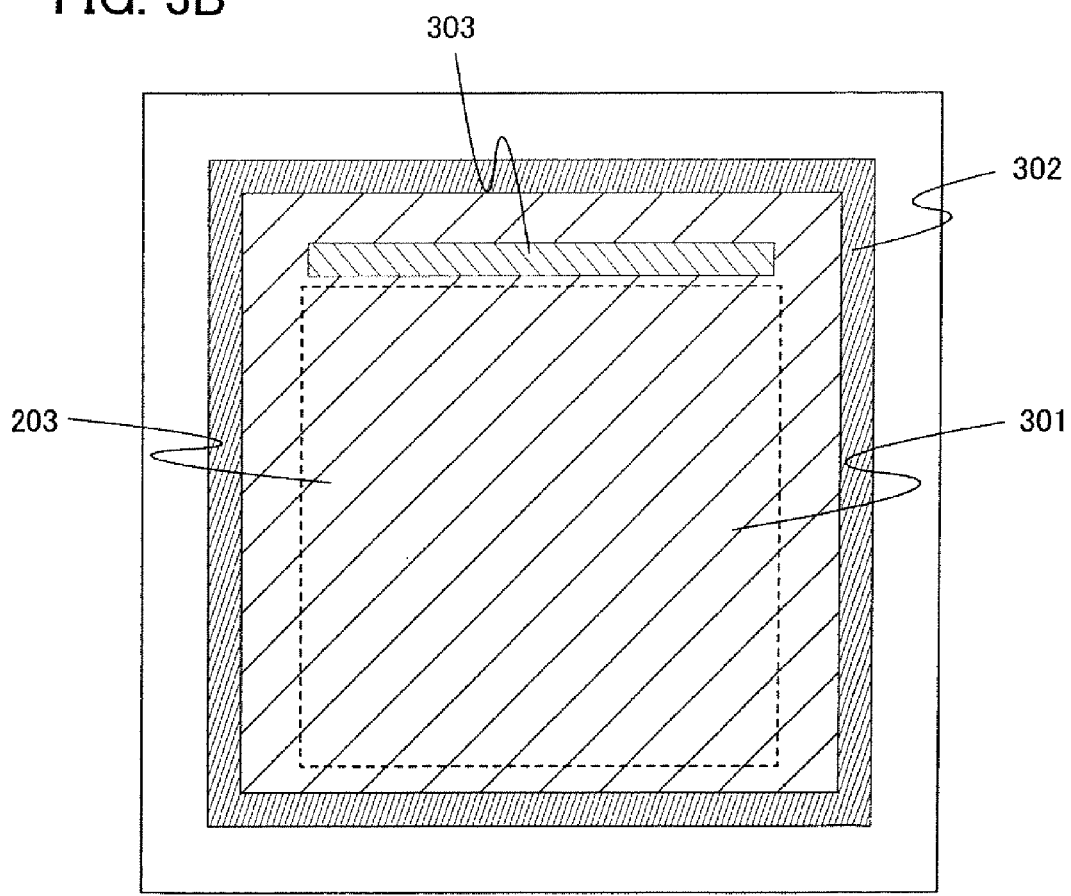

In the above structure, a mixed film 203 of an inorganic compound and an organic compound is formed so as to cover the entire pixel region as shown in FIGS. 3A and 3B. For formation of the mixed film 203, any of a variety of method can be employed regardless of whether the method is a dry process or a wet process. As a dry process, a vacuum evaporation method, a sputtering method, or the like can be used. In addition, as a wet process, an inkjet method, a spin coating method, a printing method, or the like can be used.

Preferably, the mixed film 203 covers the entire region except the sealing region and the contact portion of the second electrode and the wiring as shown in FIGS. 3A and 3B, because the mixed film 203 is a layer that is a basis for the buffer layer and the partition wall. On the other hand, when the mixed film 203 is extremely highly conductive, there is no problem caused by forming over the contact portion 303 of the second electrode and the wiring; thus, when the mixed film is formed over the contact portion 303 of the second electrode and the wiring, the simple substance of a halogen is preferably added to the mixed film located over the contact portion 303 of the second electrode and the wiring.

Figure 4A:
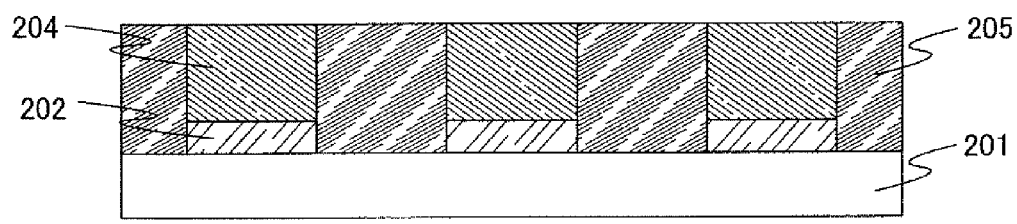
FIGS. 4A and 4B illustrate a method for manufacturing a light-emitting device of the present invention.
Figure 4B:
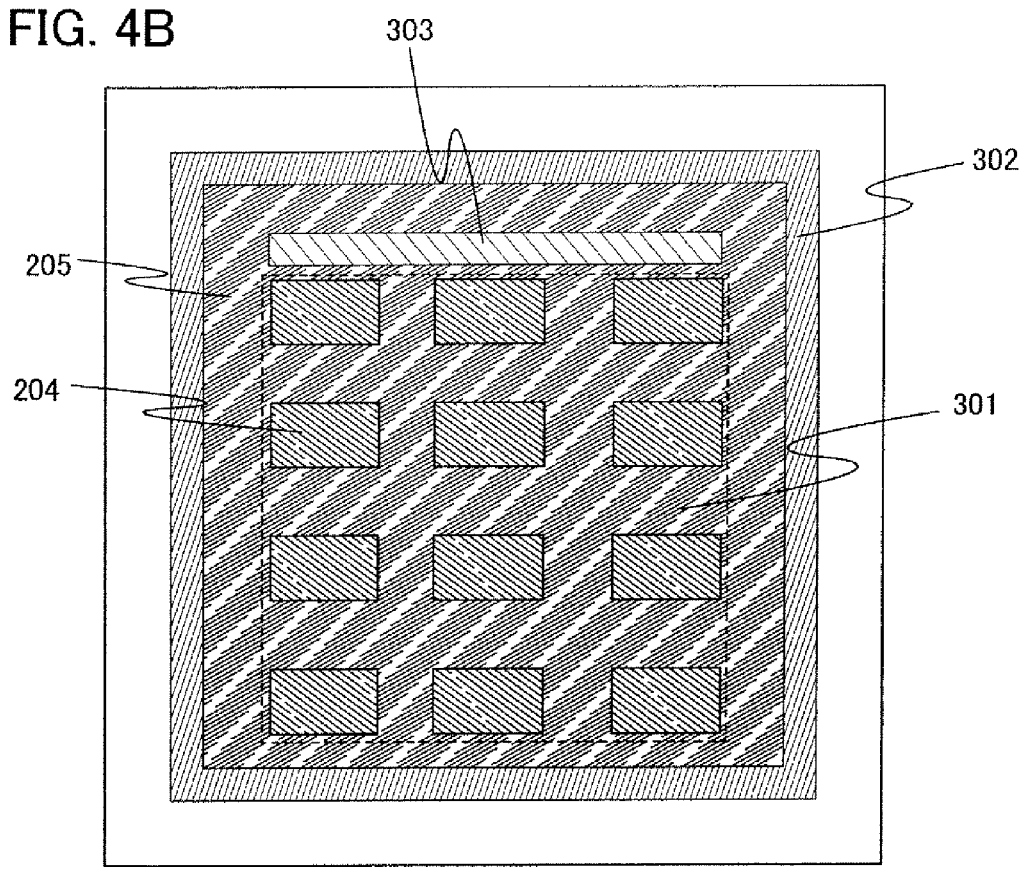

In the above structure, only the portion located over the first electrode is selectively to which the simple substance of a halogen is added as shown in FIGS. 4A and 4B. By addition of the simple substance of a halogen, the conductivity of the portion in the mixed film 203 to which the simple substance of a halogen is added drastically improves. Accordingly, the region to which the simple substance of a halogen is added functions as the buffer layer 204, and the region which is not to which the simple substance of a halogen is added functions as the partition wall 205. Thus, the buffer layer 204 and the partition wall 205 have the same film thickness or almost the same film thickness. Specifically, a change in film thickness of the buffer layer is within ±5% of film thickness of the mixed film measured before the addition of the simple substance of a halogen.

As a method for adding the simple substance of a halogen, an ion implantation process is preferable. Partial implantation using a metal mask may be performed, and alternatively a single ion implantation process based on a convergent ion beam technique may be employed.

When the mixed film 203 itself is highly conductive, it is not suitable for the partition wall 205; therefore, the mixture ratio of an inorganic compound is preferably low. At the same time, mixture of an inorganic compound is necessary because addition of the simple substance of a halogen to only an organic compound has less effect on an improvement in conductivity. The weight percent of the inorganic compound in the mixed film is preferably greater than or equal to 5% and less than or equal to 25%.

In addition, the concentration of a halogen atom contained in the buffer layer is preferably $1 \times 10^{21}$ atoms/cm$^3$ or more. For example, although the resistivity of the mixed film containing NPB and molybdenum trioxide (a film formed by a co-evaporation method so that the weight ratio is 4:1=molybdenum trioxide:NPB) is $1.8 \times 10^9$ Ω·cm, when addition of fluorine is performed at a concentration of $1 \times 10^{21}$ atoms/cm$^3$, the resistivity of the mixed film becomes $3.5 \times 10^5$ Ω·cm.

In this mode, after the formation of the buffer layer 204 and the partition wall 205, a light-emitting element can be fabricated without exposure of the substrate to air; thus, moisture does not easily enter the light-emitting element, whereby a highly reliable light-emitting element can be fabricated.

Embodiment Mode 3

In this embodiment mode, a light-emitting device of the present invention is described.

In this embodiment mode, the light-emitting device of the present invention is described using FIGS. 5A and 5B. FIG. 5A is a top view of the light-emitting device, and FIG. 5B is a cross-sectional view taken along lines A-A' and B-B' of FIG. 5A. The light-emitting device has a driver circuit portion (a source side driver circuit) 601, a pixel portion 602, and a driver circuit portion (a gate side driver circuit) 603 to control the light-emitting device, which are indicated by dotted lines. Reference numerals 604 and 605 denote a sealing substrate and a sealing material, respectively. A portion enclosed by the sealing material 605 corresponds to a space 607.

A lead wiring 608 is used to transmit signals to be inputted to the source side driver circuit 601 and the gate side driver circuit 603 and receives a video signal, a clock signal, a start signal, a reset signal, and the like from a flexible printed circuit (FPC) 609 which is an external input terminal. It is to be noted that only the FPC is illustrated in this case; however, the FPC may be provided with a printed wiring board (PWB). The category of a light-emitting device in this specification includes not only a light-emitting device itself but also a light-emitting device to which an FPC or a PWB is attached.

Next, a cross-sectional structure is described using FIG. 5B. The driver circuit portion and the pixel portion are formed over an element substrate 610. In this case, one pixel in the pixel portion 602 and the source side driver circuit 601 which is the driver circuit portion are illustrated.

A CMOS circuit, which is a combination of an n-channel TFT 623 and a p-channel TFT 624, is formed as the source side driver circuit 601. Each driver circuit portion may be any of a variety of circuits such as a CMOS circuit, a PMOS circuit, or an NMOS circuit. Although a driver-integration type device in which a driver circuit is formed over the substrate where the pixel portion is formed is described in this embodiment mode, a driver circuit is not necessarily be formed over the substrate where the pixel portion is formed but can be formed externally from a substrate.

The pixel portion 602 is formed of a plurality of pixels each of which includes a switching TFT 611, a current control TFT 612, and a first electrode 613 which is electrically connected to a drain of the current control TFT 612. It is to be noted that a partition wall 614 is formed to cover end portions of the first electrode 613. For the partition wall 614, as described in Embodiment Mode 1, a film formed of a mixture of an inorganic compound and an organic compound is used.

A buffer layer 619, an EL layer 616, and a second electrode 617 are formed over the first electrode 613. In this case, a material with a high work function is preferably used for the first electrode 613 that functions as an anode. For example, it is possible to use a single-layer film of an ITO film, an indium tin oxide film containing silicon, an indium oxide film containing 2 wt % to 20 wt % zinc oxide, a titanium nitride film, a chromium film, a tungsten film, a Zn film, a Pt film, or the like; a stack of a titanium nitride film and a film containing aluminum as its main component; a three-layer structure of a titanium nitride film, a film containing aluminum as its main component, and a titanium nitride film; or the like. It is to be noted that when a stacked structure is employed, resistance as a wiring is low, a good ohmic contact is formed, and further, the first electrode 613 can be made to function as an anode.

As described in Embodiment Mode 1, the buffer layer 619 is formed using a film formed by addition of the simple substance of a halogen to a film containing a mixture of an inorganic compound and an organic compound which is also used for the partition wall 614.

The EL layer 616 is formed by any of a variety of methods such as an evaporation method using an evaporation mask, an inkjet method, and a spin coating method. The EL layer 616 includes a hole-transporting layer, a light-emitting layer, and the like which are formed over the buffer layer.

In the contact portion 620, the second electrode 617 is electrically connected to the wiring 621, Desirably, no organic compound exists in the contact portion 620 as shown in FIGS. 5A and 5B.

For the second electrode 617 which is formed over the EL layer 616 and functions as a cathode, use of a material with a low work function (e.g., Al, Mg, Li, Ca, or an alloy or a compound thereof such as MgAg, MgIn, AlLi, LiF, or CaF$_2$) is preferable. It is to be noted that, when light emitted from the EL layer 616 is transmitted through the second electrode 617, the second electrode 617 is preferably formed using a stack of a metal thin film with a reduced thickness and a transparent conductive film (e.g., ITO, indium tin oxide containing 2 wt % to 20 wt % zinc oxide, indium tin oxide containing silicon or silicon oxide, or zinc oxide (ZnO)).

The sealing substrate 606 is attached using the sealing material 605 to the element substrate 610; thus, a light-emitting element 618 is provided in the space 607 enclosed by the element substrate 610, the sealing substrate 606, and the sealing material 605. It is to be noted that the space 607 is filled with a filler. The space 607 is filled with an inert gas (e.g., nitrogen or argon) or the sealing material 605 in some cases.

It is preferable that an epoxy-based resin be used to form the sealing material 605 and that such a material permeate little moisture and oxygen as much as possible. Alternatively, the sealing substrate 604 can be formed of a glass substrate, a quartz substrate, a plastic substrate made of fiberglass-reinforced plastic (FRP), polyvinyl fluoride (PVF), polyester, acrylic, or the like.

Accordingly, the light-emitting device of the present invention can be obtained.

The light-emitting device of the present invention employs the element structure described in Embodiment Mode 1, and thus a light-emitting device with good properties can be obtained. Specifically, a light-emitting device with higher reliability and fewer defects can be obtained.

Embodiment Mode 4

In this embodiment mode, an electronic apparatus of the present invention which has the light-emitting device described in Embodiment Mode 3 are described.

Examples of the electronic apparatus having the light-emitting device of the present invention include cameras such as video cameras or digital cameras, goggle type displays, navigation systems, audio playback devices (e.g., car audio systems and audio systems), computers, game machines, portable information terminals (e.g., mobile computers, cellular telephones, portable game machines, and electronic books), image playback devices in which a recording medium is provided (specifically, devices that are capable of playing back recording media such as digital versatile discs (DVDs) and equipped with a display unit that can display the image), and the like. Specific examples of these electronic apparatuses are shown in FIGS. 6A to 6D.

FIG. 6A shows a television set according to the present invention which includes a housing 9101, a support stand 9102, a display portion 9103, a speaker portion 9104, a video input terminal 9105, and the like. In the television set, the display portion 9103 has a light-emitting device similar to that described in Embodiment Mode 1. The light-emitting device has features of higher reliability and fewer defects. Since the display portion 9103 having the light-emitting device has similar features, the television set hardly deteriorates and has fewer defects in image quality.

FIG. 6B shows a computer according to the present invention which includes a main body 9201, a housing 9202, a display portion 9203, a keyboard 9204, an external connection port 9205, a pointing device 9206, and the like. In the computer, the display portion 9203 has a light-emitting device similar to that described in Embodiment Mode 1. The light-emitting device has features of higher reliability and fewer defects. Since the display portion 9203 having the light-emitting device has similar features, the computer hardly deteriorates and has fewer defects in image quality.

FIG. 6C shows a cellular telephone according to the present invention which includes a main body 9601, a housing 9602, a display portion 9603, an audio input portion 9604, an audio output portion 9605, operation keys 9606, an external connection port 9607, an antenna 9608, and the like. In the cellular telephone, the display portion 9603 has a light-emitting device similar to that described in Embodiment Mode 1. The light-emitting device has features of higher reliability and fewer defects. Since the display portion 9403 having the light-emitting device has similar features, the cellular telephone hardly deteriorates and has fewer defects in image quality.

FIG. 6D shows a camera according to the present invention which includes a main body 9501, a display portion 9502, a housing 9503, an external connection port 9504, a remote control receiver 9505, an image receiver 9506, a battery 9507, an audio input portion 9508, operation keys 9509, an eye piece portion 9510, and the like. In the camera, the display portion 9502 has a light-emitting device similar to that described in Embodiment Mode 1. The light-emitting device has features of higher reliability and fewer defects. Since the display portion 9502 having the light-emitting device has similar features, the camera hardly deteriorates and has fewer defects in image quality.

As described above, the applicable range of the light-emitting device of the present invention is extremely wide so that this light-emitting device can be applied to electronic apparatuses of a variety of fields. By use of the light-emitting device of the present invention, an electronic apparatus having a display portion with higher reliability and fewer defects can be provided.

Such a light-emitting device of the present invention can also be used as a lighting apparatus. One mode in which the light-emitting device of the present invention is used for a lighting apparatus is described using FIG. 7.

Figure 7:
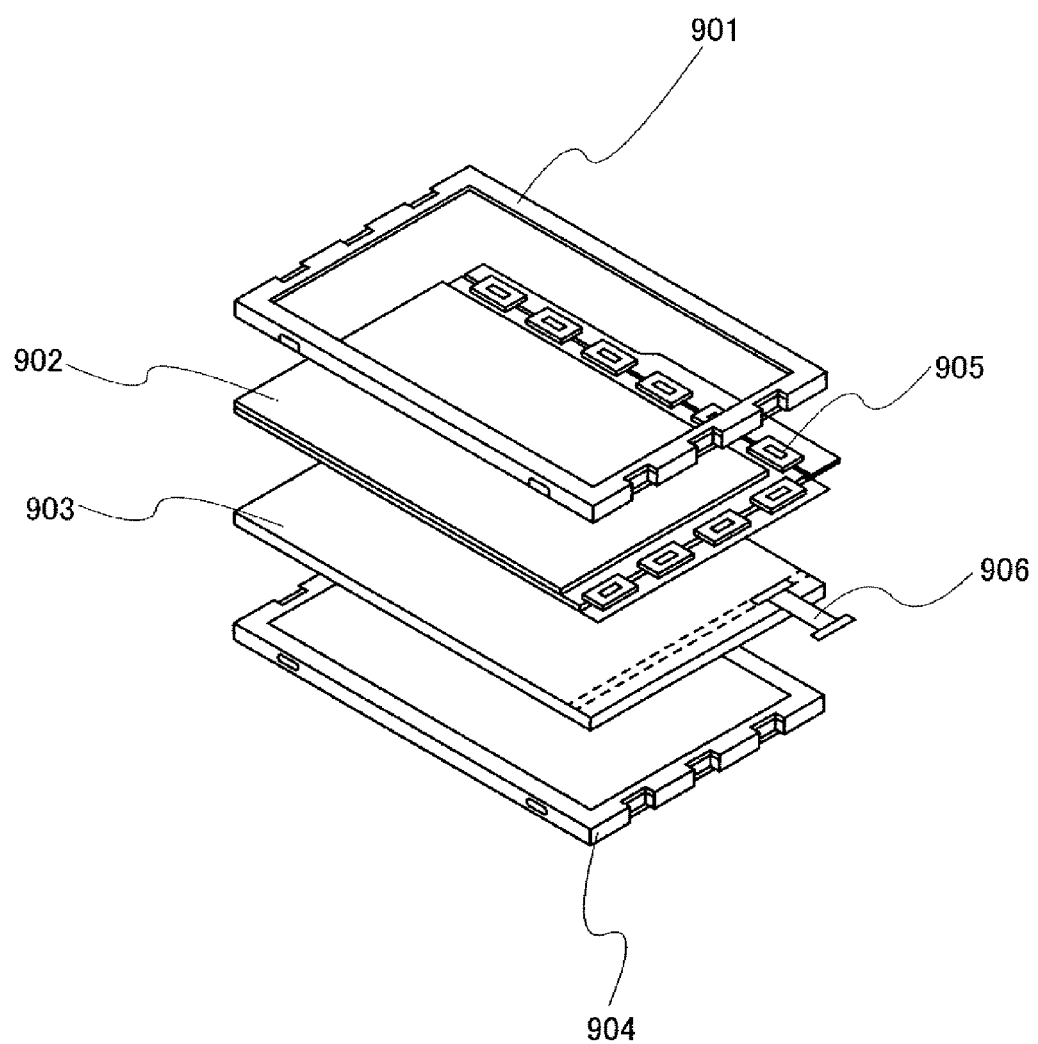
FIG. 7 illustrates an electronic apparatus of the present invention.

FIG. 7 shows an example of a liquid crystal display device in which the light-emitting device of the present invention is used as a backlight. The liquid crystal display device shown in FIG. 7 includes a housing 901, a liquid crystal layer 902, a backlight 903, and a housing 904. The liquid crystal layer 902 is connected to a driver IC 905. The light-emitting device of the present invention is used as the backlight 903, and a current is supplied through a terminal 906.

With the light-emitting device of the present invention used as the backlight of the liquid crystal display device, a backlight with higher reliability and fewer defects can be obtained. Since the light-emitting device of the present invention is a lighting apparatus with plane light emission and can be made to have a larger area, the backlight can be made to have a larger area, and a liquid crystal display device can also be made to have a larger area as well. Furthermore since the light-emitting device of the present invention is thin, a thinner shape of a display device can also be achieved. Further still, since the light-emitting device of the present invention has higher reliability and fewer defects, a liquid crystal display device in which the light-emitting device of the present invention is used has higher reliability and fewer defects as well.

Figure 8:
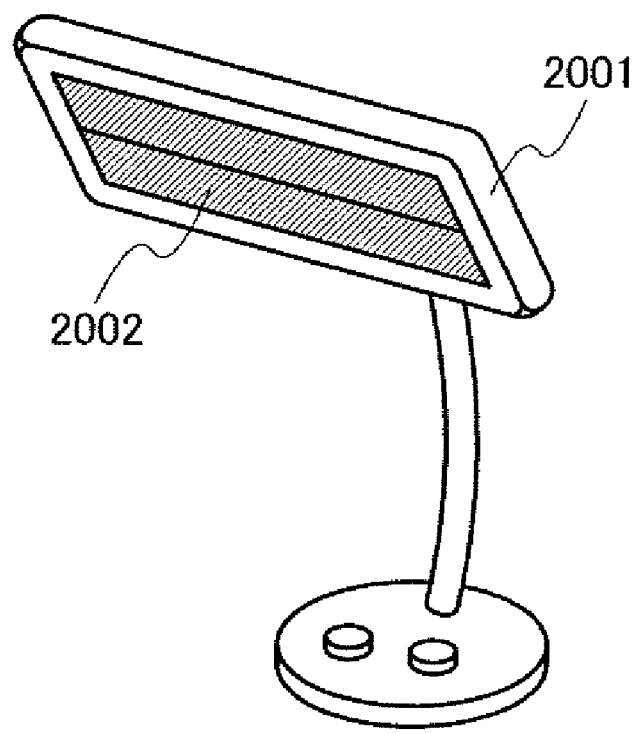
FIG. 8 illustrates a lighting apparatus of the present invention.

FIG. 8 shows an example in which the light-emitting device to which the present invention is applied is used for a table lamp which is a lighting apparatus. The table lamp shown in FIG. 8 has a housing 2001 and a light source 2002. The light-emitting device of the present invention is used for the light source 2002. Since the light-emitting device of the present invention has higher reliability and fewer defects, the table lamp also has higher reliability and fewer defects.

Figure 9:
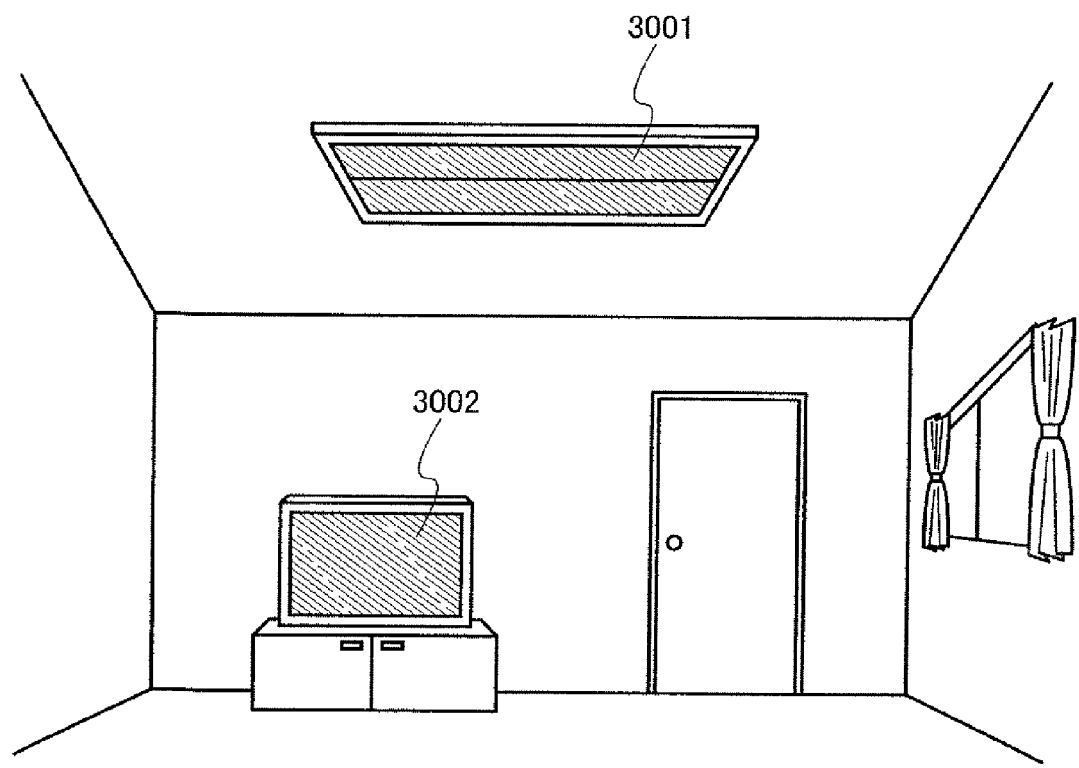
FIG. 9 illustrates a lighting apparatus of the present invention.

FIG. 9 shows an example in which a light-emitting device to which the present invention is applied is used for an indoor lighting apparatus 3001. Since the light-emitting device of the present invention can be made to have a larger area, it can be used for a lighting apparatus having a large emission area. Further, since the light-emitting device of the present invention is thin, the light-emitting device of the present invention can be used for a lighting apparatus having a thinner shape. In a room where a light-emitting device to which the present invention is thus applied is used for the indoor lighting apparatus 3001, a television set 3002 according to the present invention as described in FIG. 6A is placed, and public broadcasting and movies can be enjoyed. In such a case, a powerful image can be watched in a bright room.

This application is based on Japanese Patent Application serial no. 2007-162046 filed with Japan Patent Office on Jun. 20, 2007, the entire contents of which are hereby incorporated by reference.

What is claimed is:

1. A light-emitting device comprising:
a light-emitting element over a substrate, the light-emitting element being partitioned from an adjacent light-emitting element by a partition wall,
wherein the light-emitting element comprises:
a first electrode;
a layer formed over the first electrode;
a light-emitting layer formed over the layer; and
a second electrode formed over the light-emitting layer,
wherein the layer contains a transition metal oxide, an organic compound and a halogen atom, the organic compound being an aromatic amine compound or an aromatic hydrocarbon,
wherein a top surface of the layer is aligned with a top surface of the partition wall, and
wherein the partition wall contains the transition metal oxide and the organic compound.

2. The light-emitting device according to claim 1, wherein the layer has a higher conductivity than the partition wall.

3. The light-emitting device according to claim 1, wherein a difference between a film thickness of the layer and a film thickness of the partition wall is within ±5% of the film thickness of the partition wall.

4. The light-emitting device according to claim 1, wherein a concentration of the halogen atom contained in the layer is $1 \times 10^{21}$ atoms/cm$^3$ or more.

5. The light-emitting device according to claim 1, wherein a weight percent of the transition metal oxide in the layer is greater than or equal to 5% and less than or equal to 25%.

6. The light-emitting device according to claim 1, wherein the transition metal oxide is molybdenum oxide.

7. The light-emitting device according to claim 1, wherein the transition metal oxide is molybdenum trioxide.

8. The light-emitting device according to claim 1, wherein the halogen atom is fluorine or chlorine.

9. The light-emitting device according to claim 1, wherein each of a film thickness of the layer and a film thickness of the partition wall is 500 nm or more.

10. The light-emitting device according to claim 1, wherein the light-emitting device is incorporated in one selected from the group consisting of a television set, a computer, a cellular telephone, a camera, a backlight of a liquid crystal display device, a table lamp and an indoor lighting apparatus.

11. A light-emitting device comprising:
a light-emitting element over a substrate, the light-emitting element being partitioned from an adjacent light-emitting element by a partition wall,
wherein the light-emitting element comprises:
a first electrode;
a layer formed over the first electrode;
a light-emitting layer formed over the layer; and
a second electrode formed over the light-emitting layer,
wherein the layer contains a transition metal oxide, an organic compound and a halogen atom,
wherein a top surface of the layer is aligned with a top surface of the partition wall, and
wherein the partition wall contains the transition metal oxide and the organic compound.

12. The light-emitting device according to claim 11, wherein the layer has a higher conductivity than the partition wall.

13. The light-emitting device according to claim 11, wherein a difference between a film thickness of the layer and a film thickness of the partition wall is within ±5% of the film thickness of the partition wall.

14. The light-emitting device according to claim 11, wherein a concentration of the halogen atom contained in the layer is $1 \times 10^{21}$ atoms/cm$^3$ or more.

15. The light-emitting device according to claim 11, wherein a weight percent of the transition metal oxide in the layer is greater than or equal to 5% and less than or equal to 25%.

16. The light-emitting device according to claim 11, wherein the transition metal oxide is molybdenum oxide.

17. The light-emitting device according to claim 11, wherein the transition metal oxide is molybdenum trioxide.

18. The light-emitting device according to claim 11, wherein the halogen atom is fluorine or chlorine.

19. The light-emitting device according to claim 11, wherein each of a film thickness of the layer and a film thickness of the partition wall is 500 nm or more.

20. The light-emitting device according to claim 11, wherein the light-emitting device is incorporated in one selected from the group consisting of a television set, a computer, a cellular telephone, a camera, a backlight of a liquid crystal display device, a table lamp and an indoor lighting apparatus.

21. A light-emitting device comprising:
a light-emitting element over a substrate, the light-emitting element being partitioned from an adjacent light-emitting element by a partition wall,
wherein the light-emitting element comprises:
a first electrode;
a layer formed over the first electrode;
a light-emitting layer formed over the layer; and
a second electrode formed over the light-emitting layer,
wherein the layer contains a transition metal oxide, an organic compound and a halogen atom, the organic compound being an aromatic amine compound or an aromatic hydrocarbon,
wherein the partition wall contains the transition metal oxide and the organic compound, and
wherein a thickness of the partition wall is equal to a sum of a thickness of the layer and a thickness of the first electrode.

22. The light-emitting device according to claim 21, wherein the layer has a higher conductivity than the partition wall.

23. The light-emitting device according to claim 21, wherein a difference between a film thickness of the layer and a film thickness of the partition wall is within ±5% of the film thickness of the partition wall.

24. The light-emitting device according to claim 21, wherein a concentration of the halogen atom contained in the layer is $1 \times 10^{21}$ atoms/cm$^3$ or more.

25. The light-emitting device according to claim 21, wherein a weight percent of the transition metal oxide in the layer is greater than or equal to 5% and less than or equal to 25%.

26. The light-emitting device according to claim 21, wherein the transition metal oxide is molybdenum oxide.

27. The light-emitting device according to claim 21, wherein the transition metal oxide is molybdenum trioxide.

28. The light-emitting device according to claim 21, wherein the halogen atom is fluorine or chlorine.

29. The light-emitting device according to claim 21, wherein each of a film thickness of the layer and a film thickness of the partition wall is 500 nm or more.

30. The light-emitting device according to claim 21, wherein the light-emitting device is incorporated in one selected from the group consisting of a television set, a computer, a cellular telephone, a camera, a backlight of a liquid crystal display device, a table lamp and an indoor lighting apparatus.

31. A light-emitting device comprising:
a light-emitting element over a substrate, the light-emitting element being partitioned from an adjacent light-emitting element by a partition wall,
wherein the light-emitting element comprises:
a first electrode;
a layer formed over the first electrode;
a light-emitting layer formed over the layer; and
a second electrode formed over the light-emitting layer,
wherein the layer contains a transition metal oxide, an organic compound and a halogen atom,
wherein the partition wall contains the transition metal oxide and the organic compound, and
wherein a thickness of the partition wall is equal to a sum of a thickness of the layer and a thickness of the first electrode.

32. The light-emitting device according to claim 31, wherein the layer has a higher conductivity than the partition wall.

33. The light-emitting device according to claim 31, wherein a difference between a film thickness of the layer and a film thickness of the partition wall is within ±5% of the film thickness of the partition wall.

34. The light-emitting device according to claim 31, wherein a concentration of the halogen atom contained in the layer is $1 \times 10^{21}$ atoms/cm$^3$ or more.

35. The light-emitting device according to claim 31, wherein a weight percent of the transition metal oxide in the layer is greater than or equal to 5% and less than or equal to 25%.

36. The light-emitting device according to claim 31, wherein the transition metal oxide is molybdenum oxide.

37. The light-emitting device according to claim 31, wherein the transition metal oxide is molybdenum trioxide.

38. The light-emitting device according to claim 31, wherein the halogen atom is fluorine or chlorine.

39. The light-emitting device according to claim 31, wherein each of a film thickness of the layer and a film thickness of the partition wall is 500 nm or more.

40. The light-emitting device according to claim 31, wherein the light-emitting device is incorporated in one selected from the group consisting of a television set, a computer, a cellular telephone, a camera, a backlight of a liquid crystal display device, a table lamp and an indoor lighting apparatus.

* * * * *